(12) United States Patent
Wang et al.

(10) Patent No.: US 12,456,698 B2
(45) Date of Patent: Oct. 28, 2025

(54) PAD STRUCTURES FOR SEMICONDUCTOR DEVICES

(71) Applicant: Yangtze Memory Technologies Co., Ltd., Hubei (CN)

(72) Inventors: Yihuan Wang, Wuhan (CN); Mingkang Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 407 days.

(21) Appl. No.: 17/503,077

(22) Filed: Oct. 15, 2021

(65) Prior Publication Data

US 2023/0062321 A1 Mar. 2, 2023

Related U.S. Application Data

(63) Continuation of application No. PCT/CN2021/115512, filed on Aug. 31, 2021.

(51) Int. Cl.
*H01L 23/00* (2006.01)
*H01L 23/48* (2006.01)
(Continued)

(52) U.S. Cl.
CPC ............ *H01L 24/05* (2013.01); *H01L 23/481* (2013.01); *H01L 23/5226* (2013.01);
(Continued)

(58) Field of Classification Search
CPC ....... H01L 25/0657; H01L 2224/08146; H01L 21/02164; H01L 21/0228;
(Continued)

(56) References Cited

U.S. PATENT DOCUMENTS

| 2014/0264498 A1* | 9/2014 | Han | H01L 29/78 438/585 |
| 2018/0122907 A1* | 5/2018 | Choi | H10B 41/35 |

(Continued)

FOREIGN PATENT DOCUMENTS

| CN | 111566815 A | 8/2020 |
| CN | 111566816 A | 8/2020 |

(Continued)

OTHER PUBLICATIONS

International Search Report issued May 17, 2022, in PCT/CN2021/115512, 4 pages.

(Continued)

*Primary Examiner* — William B Partridge
*Assistant Examiner* — David Paul Sedorook
(74) *Attorney, Agent, or Firm* — Oblon, McClelland, Maier &Neustadt, L.L.P.

(57) ABSTRACT

Aspects of the disclosure provide a semiconductor device and a method to fabricate the semiconductor device. The semiconductor device includes a first die comprising a first contact structure formed on a face side of the first die. The semiconductor device includes a first semiconductor structure and a first pad structure that are disposed on a back side of the first die. The first semiconductor structure is conductively connected with the first contact structure from the back side of the first die and the first pad structure is conductively coupled with the first semiconductor structure. An end of the first contact structure protrudes into the first semiconductor structure without connecting to the first pad structure. The first die and a second die can be bonded face-to-face.

20 Claims, 11 Drawing Sheets

(51) Int. Cl.
  *H01L 23/522*   (2006.01)
  *H01L 23/528*   (2006.01)
  *H01L 25/065*   (2023.01)
  *H10B 41/27*    (2023.01)
  *H10B 41/35*    (2023.01)
  *H10B 41/40*    (2023.01)

(52) U.S. Cl.
  CPC .......... *H01L 23/5283* (2013.01); *H01L 24/03* (2013.01); *H01L 24/08* (2013.01); *H01L 25/0657* (2013.01); *H10B 41/27* (2023.02); *H10B 41/35* (2023.02); *H10B 41/40* (2023.02); *H01L 2224/0362* (2013.01); *H01L 2224/05022* (2013.01); *H01L 2224/08146* (2013.01); *H01L 2225/06544* (2013.01); *H01L 2924/1431* (2013.01); *H01L 2924/1438* (2013.01)

(58) Field of Classification Search
  CPC ............. H01L 21/823425; H01L 24/05; H01L 23/5226; H01L 23/5283; H01L 24/03; H01L 24/08; H01L 2224/0362; H01L 2924/1431; H01L 2924/1438; H01L 21/6835; H01L 2225/06541; H01L 25/50; H01L 25/18; H01L 23/49811; H01L 23/49844; H01L 24/02; H10B 41/40; H10B 41/27; H10B 41/35; H10B 43/27; H10B 43/50; H10D 84/038; H10D 88/01; H10D 88/00
  See application file for complete search history.

(56) References Cited

U.S. PATENT DOCUMENTS

| | | | |
|---|---|---|---|
| 2019/0081069 A1* | 3/2019 | Lu | H10B 43/50 |
| 2019/0252361 A1* | 8/2019 | Nishida | H01L 23/13 |
| 2020/0286875 A1* | 9/2020 | Nishida | H01L 25/50 |
| 2021/0035965 A1* | 2/2021 | Mizutani | H01L 25/18 |
| 2021/0249397 A1* | 8/2021 | Kanamori | H01L 24/09 |
| 2022/0406387 A1* | 12/2022 | Vigdorchik | G11C 7/1057 |

FOREIGN PATENT DOCUMENTS

| | | |
|---|---|---|
| CN | 112204734 A | 1/2021 |
| JP | 2020-102613 A | 7/2020 |

OTHER PUBLICATIONS

Office Action dated Aug. 20, 2024, issued in Japanese application No. 2023-556565 (with computer generated English translation).
Japanese Office Action issued on Jan. 21, 2025 in the Japanese Patent Application No. 2023-556565 with English Translation, 6 pages.

* cited by examiner

PAD STRUCTURES FOR SEMICONDUCTOR DEVICES

RELATED APPLICATION

This application is a bypass continuation of International Application No. PCT/CN2021/115512 filed on Aug. 31, 2021. The entire disclosure of the prior application is hereby incorporated by reference in its entirety.

TECHNICAL FIELD

The present application describes embodiments generally related to semiconductor devices.

BACKGROUND

Generally, a semiconductor device (e.g., a semiconductor chip) communicates with the outside world through various input/output (I/O) pad structures, such as signaling pad structures, and power/ground (P/G) pad structures and the like. In some examples, a semiconductor chip can include multiple metal layers formed on top of circuitry above a substrate. One or more of the metal layers are used to form pad structures that are conductively coupled with the circuitry above the substrate. The pad structures can be formed to facilitate attachment of bonding wires that can conductively couple the pad structures with external components, such as power supply, ground, other semiconductor chips, metal lines on printed circuit board (PCB) and the like.

SUMMARY

Aspects of the disclosure provide a semiconductor device. The semiconductor device includes a first die comprising a first contact structure formed on a face side of the first die. The semiconductor device includes a first semiconductor structure that is disposed on a back side of the first die and is conductively connected with the first contact structure from the back side of the first die. The semiconductor device further includes a first pad structure disposed on the back side of the first die and conductively coupled with the first semiconductor structure.

In an embodiment, an end of the first contact structure protrudes into the first semiconductor structure without connecting to the first pad structure.

In an embodiment, the semiconductor device includes a second semiconductor structure disposed on a back side of the first die. The second semiconductor structure is conductively connected with a second contact structure from the back side of the first die. A second pad structure in the semiconductor device is disposed on the back side of the first die and is conductively coupled with the second semiconductor structure. The semiconductor device further includes a first isolation structure that is disposed between the first pad structure and the second pad structure and electrically isolates the first pad structure from the second pad structure.

In an example, the semiconductor device further includes a second isolation structure that is disposed between the first and second semiconductor structures and electrically isolates the first semiconductor structure from the second semiconductor structure.

In an embodiment, the first semiconductor structure includes a doped semiconductor material, and the first pad structure includes a metallic material. In an example, the doped semiconductor material is polysilicon.

In an embodiment, the first die includes a core region that includes a vertical memory cell string, a staircase region for making connections to gates of memory cells in the vertical memory cell string, and a contact region including the first contact structure. The core region, the staircase region, and the contact region are electrically isolated by respective isolation structures of an insulating layer disposed on the back side of the first die.

In an example, a pad structure is disposed on the back side of the first die and is conductively connected with the vertical memory cell string in the core region through a semiconductor structure that is disposed between the pad structure and the vertical memory cell string.

In an example, the semiconductor device further includes a second die comprising a periphery circuit for the vertical memory cell string on a face side of the second die. The first die and the second die are bonded face-to-face.

In an example, the first contact structure on the first die is electrically coupled to an input/output circuit on the second die via bonding structures.

Aspects of the disclosure provide a method for fabricating a semiconductor device. The method includes forming, on a back side of a first die, a first semiconductor structure that is conductively connected with a first contact structure from the back side of the first die and forming, on the back side of the first die, a first pad structure conductively connected with the first semiconductor structure. The first die includes a first substrate and the first contact structure formed on a face side of the first die.

In an embodiment, the method further includes bonding the first die and a second die face-to-face. The method includes removing the first substrate from the back side of the first die where an end of the first contact structure on the back side of the first die is exposed. The end of the first contact structure protrudes into the first semiconductor structure without connecting to the first pad structure.

In an embodiment, forming the first semiconductor structure includes forming, over the back side of the first die, a semiconductor layer over the end of the first contact structure and forming semiconductor structures by removing first portions of the semiconductor layer. First holes are formed to separate the semiconductor structures that include the first semiconductor structure and a second semiconductor structure. Forming the first semiconductor structure further includes depositing an insulating layer over the semiconductor structures and within the first holes. Portions of the insulating layer within the first holes form second isolation structures. One of the second isolation structures is disposed between and electrically isolates the first and second semiconductor structures. The first die is separated into a core region that includes a vertical memory cell string, a staircase region for making connections to gates of memory cells in the vertical memory cell string, and a contact region including the first contact structure. The core region, the staircase region, and the contact region are electrically isolated by two of the second isolation structures.

Forming the first pad structure includes removing second portions of the insulating layer to form second holes above respective ones of the semiconductor structures and forming pad structures in the second holes above the respective ones of the semiconductor structures. The pad structures including the first pad structure are electrically isolated by first isolation structures of the insulating layer.

In an example, forming the semiconductor layer includes depositing a doped semiconductor material that is conductive to form the semiconductor layer where the first semiconductor structure includes the doped semiconductor material. In an example, the doped semiconductor material is polysilicon.

In an example, one of the pad structures is in the core region, and is conductively connected with the vertical memory cell string in the core region through a semiconductor structure that is disposed between the one of the pad structures and the vertical memory cell string.

In an example, the second die comprises a periphery circuit for the vertical memory cell string.

In an embodiment, bonding the first die and the second die face-to-face further comprises bonding a first bonding structure on the first die with a second bonding structure on the second die. The first bonding structure is conductively coupled with the first contact structure on the first die and the second bonding structure is conductively coupled with an input/output circuit on the second die.

Aspects of the disclosure provide a memory system that includes a semiconductor device and a controller. The semiconductor device includes a first die, a first semiconductor structure, and a first pad structure. The first die can include a first contact structure formed on a face side of the first die. The first semiconductor structure can be disposed on a back side of the first die and is conductively connected with the first contact structure from the back side of the first die. The first pad structure can be disposed on the back side of the first die and conductively coupled with the first semiconductor structure. The controller can be configured to control operations of the semiconductor device where the controller is connected with the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
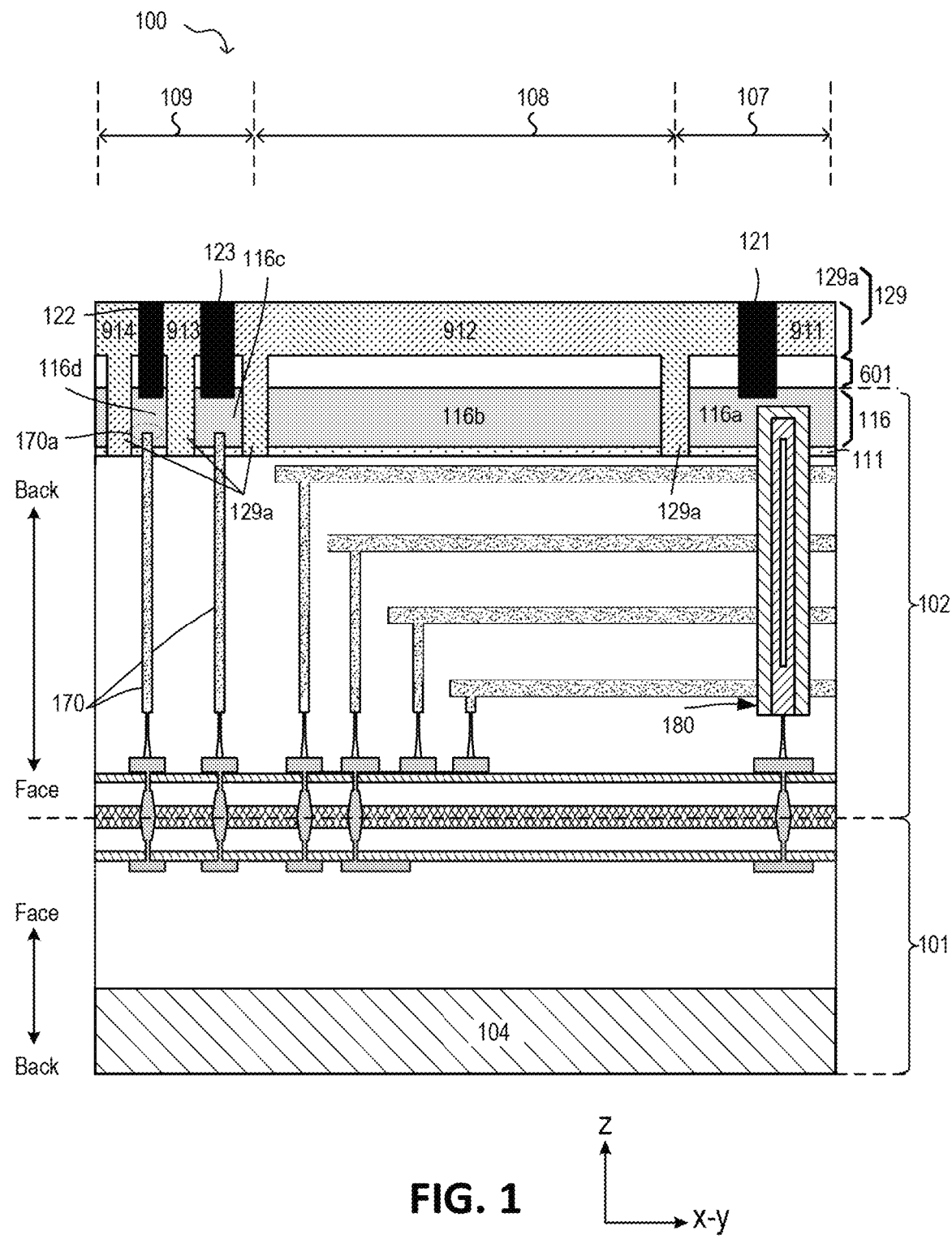
FIG. 1 shows a cross-sectional view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide techniques for forming pad structures for a semiconductor device with two dies (e.g., a first die and a second die) bonded face-to-face. In some embodiments, circuit components are formed on face sides of the two dies. The pad structures are formed on a back side of one of the two dies, such as the first die. In an example, the techniques to form the pad structures do not need to form through silicon contacts (TSC) from the back side of the first die and simplify the processes to form the pad structures.

A first pad structure is disposed on the back side of the first die and is conductively connected with a first contact structure formed on the face side of the first die where the first contact structure is connected to an input/output (I/O) circuit. According to aspects of the disclosure, the first pad structure is conductively coupled with the first contact structure through a first semiconductor structure that is disposed between the first pad structure and the first contact structure. Specifically, the first semiconductor structure is disposed on the back side of the first die and is conductively connected with the first contact structure from the back side of the first die. Further, the first pad structure disposed on the back side of the first die is conductively coupled with the first semiconductor structure. In an example, an end of the first contact structure protrudes into the first semiconductor structure without connecting to the first pad structure. In an example, the first semiconductor structure includes a highly doped semiconductor material, such as highly doped polysilicon, that has a relatively high conductivity. Accordingly, the electrical coupling between the first pad structure and the first contact structure is facilitated by the conductivity of the highly doped semiconductor structure. In an example, using the semiconductor structure reduces stress in the semiconductor device.

In an embodiment, a second pad structure is disposed on the back side of the first die and conductively coupled with a second contact structure through a second semiconductor structure that is disposed between the second pad structure and the second contact structure. According to aspects of the disclosure, a first isolation structure is disposed between the first pad structure and the second pad structure and electrically isolates the first pad structure from the second pad structure.

In some examples, the first die includes a core region having vertical memory cell strings. In some embodiments, a pad structure in the core region can be configured as connection of an array common source for one or more of the vertical memory cell strings.

According to some aspects of the disclosure, the semiconductor device can be a semiconductor memory device in which one of the two dies includes a memory cell array, such as vertical memory cell strings in the case of three dimensional (3D) NAND device, formed on the face side and is referred to as an array die and the other of the two dies includes periphery circuitry formed on the face side and is referred to as periphery die. In some examples, the periphery circuitry is formed using complementary metal-oxide-semiconductor (CMOS) technology, and the periphery die is also referred to as CMOS die. The pad structures can be formed on the back of the array die or can be formed on the back of the periphery die.

According to some aspects of the disclosure, the two dies (e.g., the array die and the periphery die) are formed separately on two wafers. In some embodiments, a first wafer that includes array dies and a second wafer that includes periphery dies are formed separately. For example, the first wafer can be fabricated to optimize density and performance of the vertical memory cell strings without compromising to fabrication limitations due to the periphery circuitry; and the second wafer can be fabricated to optimize the performance of the periphery circuitry without compromising to fabrication limitations due to the vertical memory cell strings. In some embodiments, the first wafer and the second wafer can be bonded face to face using a wafer-to-wafer bonding technology, thus the array dies on the first wafer are respectively bonded with periphery dies on the second wafer. Then, the techniques provided in the present disclosure can be used to fabricate pad structures on a back side of one of the two wafers.

FIG. 1 shows a cross-sectional view of a semiconductor device, such as a semiconductor device 100, according to some embodiments of the disclosure. The semiconductor device 100 includes two dies that are bonded face to face. Pad structures are formed on a back side of one of the two dies using the techniques provided in the present disclosure. In some examples, the semiconductor device 100 includes two wafers that are bonded face to face. Pad structures are formed on a back side of one of the two wafers using the techniques provided in the present disclosure.

Specifically, in the FIG. 1 example, the semiconductor device 100 includes an array die 102 and a CMOS die 101 bonded face to face. In some embodiments, a semiconductor device can include multiple array dies and a CMOS die. The multiple array dies and the CMOS die can be stacked and bonded together. The CMOS die is respectively coupled to the multiple array dies, and can drive the respective array dies in a similar manner.

The semiconductor device 100 can be any suitable device. In some examples, the semiconductor device 100 includes at least a first wafer and a second wafer bonded face to face. The array die 102 is disposed with other array dies on the first wafer, and the CMOS die 101 is disposed with other CMOS dies on the second wafer. The first wafer and the second wafer are bonded together, thus the array dies on the first wafer are bonded with corresponding CMOS dies on the second wafer. In some examples, the semiconductor device 100 is a semiconductor chip with at least the array die 102 and the CMOS die 101 bonded together. In an example, the semiconductor chip is diced from wafers that are bonded together. In another example, the semiconductor device 100 is a semiconductor package that includes one or more semiconductor chips assembled on a package substrate.

The array die 102 includes regions 107-109 that are separated and electrically isolated by second isolation structures 129a of an insulating layer 129. The insulating layer 129 is disposed on the back side of the array die 102. Memory cell arrays can be formed in the region 107. The region 107 can be referred to as a core region 107. The region 108 can be referred to as a staircase region 108 and can be used to facilitate making connections to, for example, gates of the memory cells in the memory cell arrays, gates of select transistors, and the like. The gates of the memory cells in the memory cell arrays correspond to word lines for a NAND memory architecture. The region 109 can provide space for contact structures 170. The CMOS die 101 includes a substrate 104, and peripheral circuitry formed on the substrate 104. For simplicity, the main surface (of the dies or wafers) is referred to as an X-Y plane, and the direction perpendicular to the main surface is referred to as Z direction.

Further, in the FIG. 1 example, pad structures 121-123 are formed on a back side of one of the two dies, such as the array die 102, in a stack of layers.

In the FIG. 1 example, the stack of layers on the back side of the array die 102 includes a first etch stop layer 111, a semiconductor layer 116, an insulating layer 601, and an insulating layer 129 that are stacked over the back side of the array die 102. Further, the insulating layer 129 separates the first etch stop layer 111, the semiconductor layer 116, and the insulating layer 601 into portions of the first etch stop layer 111, semiconductor structures 116a-116d of the semiconductor layer 116, and portions (e.g., 601a-601d in FIG. 7) of the insulating layer 601. Referring to FIG. 1, the second isolation structures 129a of the insulating layer 129 separate the first etch stop layer 111, the semiconductor layer 116, and the insulating layer 601. In an example, the insulating layer 601 is omitted.

According to some aspects of the disclosure, the pad structures (e.g., 121-123) are formed respectively above semiconductor structures formed using the semiconductor layer 116, such as shown by semiconductor structures 116a, 116c and 116d. The pad structures can be separated and electrically isolated by the insulating layer 129. Referring to FIG. 1, the insulating layer 129 includes the second isolation structures 129a and first insulating structures 911-914. A set of the first insulating structures 911-914 separate the pad structures. For example, the pad structures 121 and 123 are separated by the first insulating structure 912, and the pad structures 122 and 123 are separated by the first insulating structure 913.

The semiconductor structures 116a-116d are above respective portions of the first etch stop layer 111. Certain pad structures (e.g., 122-123) can be conductively connected with one or more of the contact structures 170, and certain pad structure(s) (e.g., 121) can be configured as connections of array common source for the vertical memory cell strings 180 in the core region 107.

According to aspects of the disclosure, a pad structure (e.g., one of the pad structures 122-123) can be disposed on the back side of the first die and can be conductively coupled with contact structure(s) 170 through a semiconductor structure that is disposed between the pad structure and the contact structure(s). The semiconductor structure can be conductively connected with the contact structure(s) on the back side of the first die. Further, the pad structure is conductively coupled with the semiconductor structure.

Referring to FIG. 1, the semiconductor structure 116d is disposed between the pad structure 122 and the contact structure 170. The semiconductor structure 116d conductively couples the pad structure 122 and the contact structure 170. In some examples, an end 170a of the contact structure 170 protrudes into the semiconductor structure 116d without connecting to the pad structure 122. Accordingly, the pad structure 122 does not connect to the contact structure 170 directly. The electrical connection or coupling between the pad structure 122 and the contact structure 170 is formed using the semiconductor structure 116d.

Other pad structures (e.g., 121, 123) can have similar or identical structure and material(s) as those described for the pad structure 122, and thus detailed descriptions are omitted for purposes of brevity.

The pad structures (e.g., 121-123) can include any suitable conductive materials, such as metallic material(s) (e.g., aluminum (Al), copper (Cu), tungsten (W), and/or the like). In an example, the metallic material(s) used in the pad structures (e.g., 121-123) facilitates attachment of bonding wires. The pad structures can be formed using any suitable method, such as physical vapor deposition (PVD), plating (or electroplating), and/or the like. In an example, plating (or electroplating) is used to form Cu. In an example, the pad structures 121-123 are formed using a same process and include same material(s).

The semiconductor structures (e.g., 116a-116d) can include any suitable semiconductor material or a combination of semiconductor materials. In an example, the semiconductor structures (e.g., 116a-116d) include a doped semiconductor material. For example, the doped semiconductor material is silicon (Si), such as polysilicon. In an example, a doping level in the doped semiconductor material is relatively high, and the semiconductor structures (e.g., 116a-116d) have a relatively good conductivity. In an example, sheet resistance of the semiconductor structures (e.g., 116a-116d) is less than 1000 Ω/sq. In an example, the semiconductor structures (e.g., 116a-116d) are formed by depositing highly doped Si using chemical vapor deposition (CVD). In an example, the semiconductor structures (e.g., 116a-116d) are formed using furnace CVD. In some examples, the deposition process is followed by an annealing process such that the highly doped Si is recrystallized, facilitating growth of recrystallized grains. Thus, conductivity of the semiconductor structures (e.g., 116a-116d) are increased, and the semiconductor structures (e.g., 116a-116d) have good conductivity.

In general, two pad structures (e.g., 122-123) can be physically separated and electrically isolated by a first insulating structure (e.g., the first insulating structure 913) in the insulating layer 129. The first insulating structure (e.g., 913) can be disposed between the two pad structures (e.g., 122-123). The semiconductor structures (e.g., 116c and 116d) underneath the two respective pad structures (e.g., 122-123) are physically separated and electrically isolated by the second isolation structure (e.g., 129a). The second isolation structure (e.g., 129a) is disposed between the semiconductor structures (e.g., 116c and 116d).

In the FIG. 1 example, the pad structure 121 is above the semiconductor structure 116a. Thus, the pad structure 121 is conductively connected or coupled with a source terminal of the vertical memory cell string 180 in the region 107 through the semiconductor structure 116a. The semiconductor structure 116a is disposed between the pad structure 121 and the vertical memory cell string 180.

In some examples, the semiconductor structure 116a is coupled to source terminals of multiple vertical memory cell strings 180, and can be an array common source (ACS) for the multiple vertical memory cell strings 180. In some example, the pad structure 121 is formed of one or more metal layers of relatively low resistivity, and when the pad structure 121 covers a relatively large portion of the semiconductor structure 116a, the pad structure 121 can connect the ACS of the block of the memory cell arrays with very small parasitic resistance. The pad structure 121 can include a portion that is configured as a pad structure for ACS to receive ACS signal from an external source. The pad structure 121 can have any suitable metallic material(s). In an example, the pad structure 121 is formed together with the pad structures 122-123 in a same process, and has identical material(s) (e.g., Al, Cu, W, and/or the like) as used in the pad structures 122-123.

Some components of the semiconductor device 100, such as passivation structures, and the like are not shown for purposes of brevity.

The array die 102 initially includes a substrate. The substrate is removed before the formation of the semiconductor structures 116a-116d and the pad structures 121-123.

Figure 2:
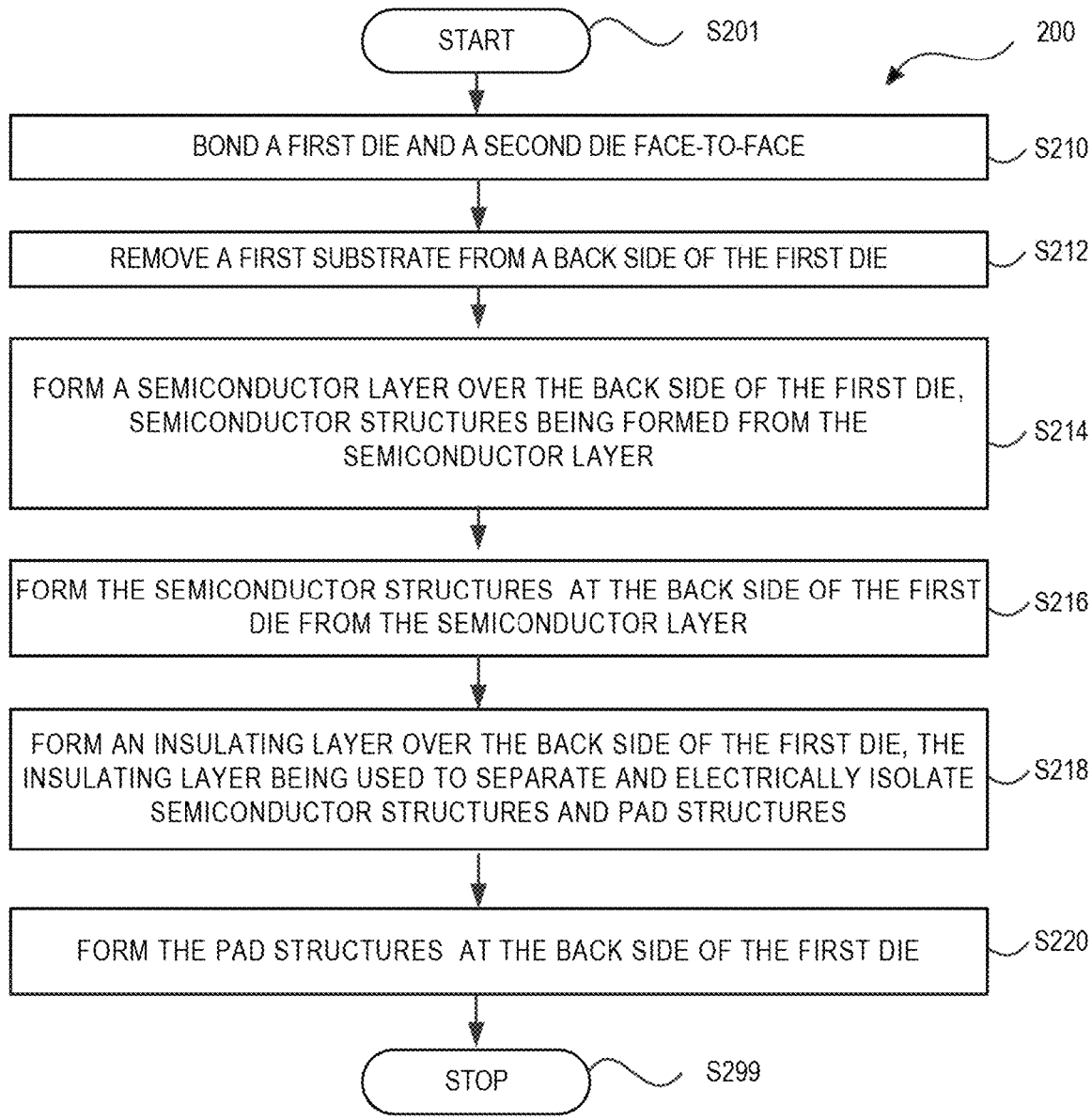
FIG. 2 shows a flow chart outlining a process for forming a semiconductor device.

FIG. 2 shows a flow chart outlining a process 200 for forming a semiconductor device, such as the semiconductor device 100 according to some embodiments of the disclosure, and FIGS. 3-10 show cross-sectional views of the semiconductor device 100 during the process in accordance with some embodiments. The process 200 starts from S201 and proceeds to S210.

At S210, a first die and a second die are bonded face-to-face. The first die includes a first substrate. In an embodiment, the first die includes multiple regions (e.g., a core region, a staircase region, a contact region, and/or the like). The first die also includes first transistors (e.g., transistors in the memory cell strings 180) formed in the core region by processing steps that operate from the face side of the first die. Further, the first die includes contact structures (e.g., contact structures 170) disposed, for example, in the contact region that is outside the core region and the staircase region. The contact structures can be formed by processing steps that operate from the face side of the first die. The second die includes a second substrate with second transistors formed on a face side of the second die.

In some embodiments, the first die is an array die, such as the array die 102 and the second die is a CMOS die, such as the CMOS die 101. In some examples, the first die can be a CMOS die and the second die can be an array die.

Figure 3:
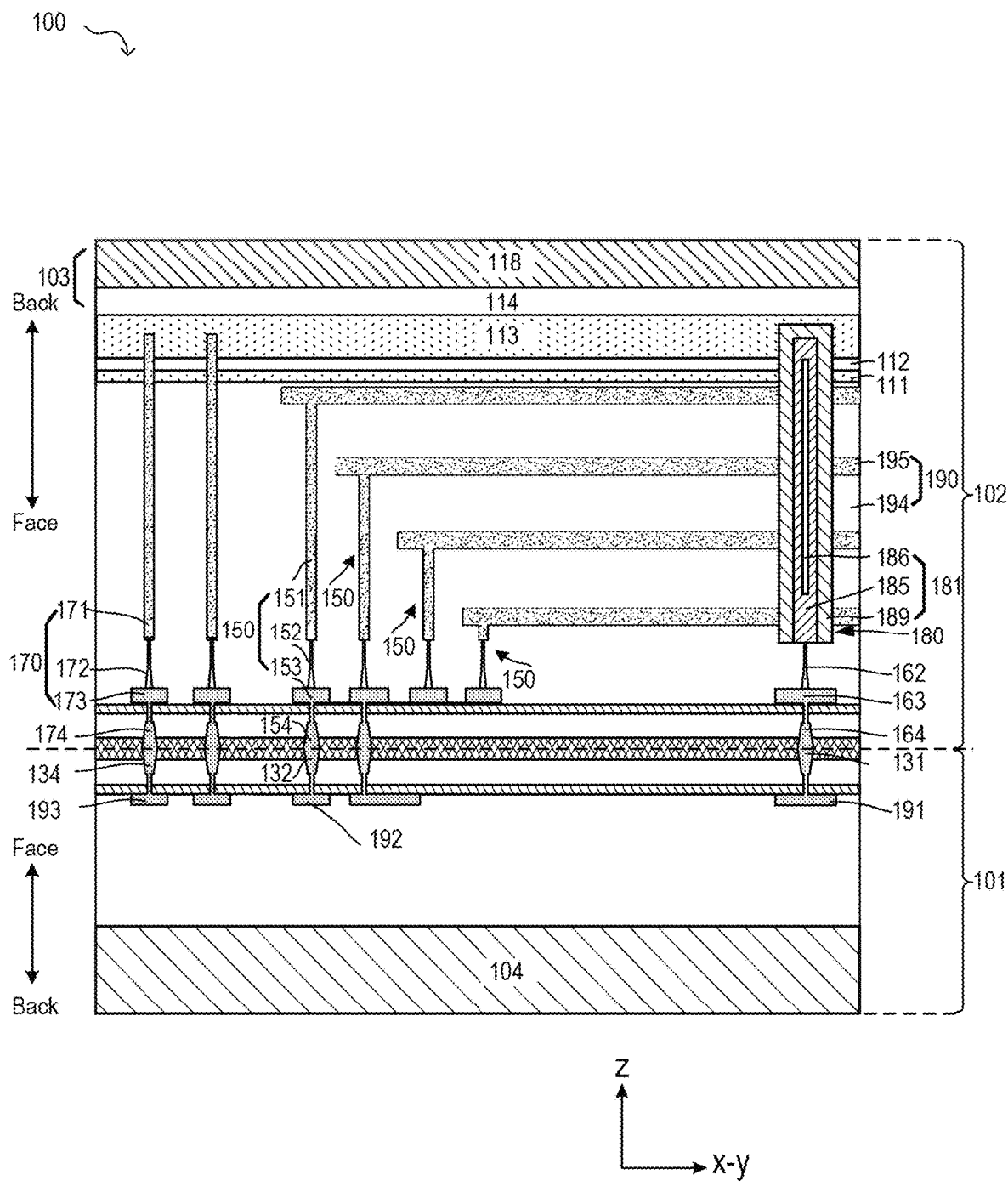
FIGS. 3-10 show cross-sectional views of a semiconductor device during a fabrication process in accordance with some embodiments.

FIG. 3 shows a cross-sectional view of the semiconductor device 100 after a bonding process of two dies. The semiconductor device 100 includes the array die 102 and the CMOS die 101 that are bonded face to face.

In some embodiments, the array die 102 is fabricated with other array dies on a first wafer, and the CMOS die 101 is fabricated with other CMOS dies on a second wafer. In some examples, the first wafer and the second wafer are fabricated separately. For examples, memory cell arrays and I/O contact structures are formed on the first wafer using processes that operate on the face side of the first wafer. Further, first bonding structures are formed on the face side of the first wafer. Similarly, periphery circuitry is formed on the second wafer using processes that operate on the face side of the second wafer, and second bonding structures are formed on the face side of the second wafer.

In some embodiments, the first wafer and the second wafer can be bonded face to face using a wafer-to-wafer bonding technology. The first bonding structures on the first wafer are bonded with the corresponding second bonding structures on the second wafer, thus the array dies on the first wafer are respectively bonded with the CMOS dies on the second wafer.

Referring to FIG. 3, the array die 102 includes a substrate 103. On the substrate 103, the regions 107-109 are formed. Memory cell arrays can be formed in the core region 107 and contact structures can be formed in the contact region 109. The staircase region 108 is used to facilitate making connections to, for example, gates of the memory cells in the vertical memory cell strings, gates of the select transistors, and the like. The CMOS die 101 includes the substrate 104, and includes peripheral circuitry formed on the substrate 104.

The substrate 103 and the substrate 104 respectively can be any suitable substrate, such as a Si substrate, a germanium (Ge) substrate, a silicon-germanium (SiGe) substrate, and/or a silicon-on-insulator (SOI) substrate. The substrate 103 and the substrate 104 respectively may include a semiconductor material, for example, a Group IV semiconductor, a Group III-V compound semiconductor, or a Group II-VI oxide semiconductor. The Group IV semiconductor may include Si, Ge, or SiGe. The substrate 103 and the substrate 104 respectively may be a bulk wafer or an epitaxial layer. In some examples, a substrate is formed of multiple layers. For example, the substrate 103 includes multiple layers, such as a bulk portion 118 and an insulating layer 114 (e.g., a silicon oxide layer), as shown in FIG. 3.

In the FIG. 3 example, the memory cell arrays are formed on the substrate 103 of the array die 102 and the peripheral circuitry is formed on the substrate 104 of the CMOS die 101. The array die 102 and the CMOS die 101 are disposed face to face (the surface with circuitry disposed on is referred to as face, and the opposite surface is referred to as back), and bonded together.

In some examples, the process steps that operate on the face side of the array die 102 can form one or more layers over the substrate 103. In an example, the one or more layers can include a conductive layer 113, a second etch stop layer 112, and the first etch stop layer 111 that are sequentially formed on the substrate 103. A block of 3D NAND memory cell strings (e.g., the memory cell strings 180) can be formed over the substrate 103. In an example shown in FIG. 3, the 3D NAND memory cell strings penetrate into the conductive layer 113. In some examples, a memory cell array is formed in the core region 107 as an array of vertical memory cell strings.

The staircase region 108 is used to facilitate making connections to, for example, gates of the memory cells in the vertical memory cell strings, gates of the select transistors, and the like. The gates of the memory cells in the vertical memory cell strings correspond to word lines for the NAND memory architecture. The contact structures 170 are formed in the contact region 109.

In the FIG. 3 example, one of the vertical memory cell strings 180 is shown as representation of an array of vertical memory cell strings formed in the core region 107. The vertical memory cell strings 180 are formed in a stack of layers 190. The stack of layers 190 includes gate layers 195 and insulating layers 194 that are stacked alternatingly. The gate layers 195 and the insulating layers 194 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 195 correspond to gates of the transistors. The gate layers 195 are made of gate stack materials, such as high dielectric constant (high-k) gate insulator layers, metal gate (MG) electrode, and the like. The insulating layers 194 are made of insulating material(s), such as silicon nitride, silicon dioxide, and the like.

In an embodiment, the vertical memory cell strings 180 are formed of respective channel structures 181 (one of the channel structures 181 is shown in FIG. 3) that extend vertically (along the Z direction) into the stack of layers 190. The channel structures 181 can be disposed separately from each other in the X-Y plane. In some embodiments, the channel structures 181 are disposed in the form of arrays between gate line cut structures (not shown). The gate line cut structures are used to facilitate replacement of sacrificial layers with the gate layers 195 in a gate-last process. The arrays of the channel structures 181 can have any suitable array shape, such as a matrix array shape along the X direction and the Y direction, a zig-zag array shape along the X or Y direction, a beehive (e.g., hexagonal) array shape, and the like. In some embodiments, each of the channel structures 181 has a circular shape in the X-Y plane, and a pillar shape in the X-Z plane and Y-Z plane. In some embodiments, the quantity and arrangement of the channel structures between gate line cut structures is not limited.

In some embodiments, the channel structure 181 has a pillar shape that extends in the Z direction that is perpendicular to the direction of the main surface of the substrate 103. In an embodiment, the channel structure 181 is formed by materials in the circular shape in the X-Y plane, and extends in the Z direction. For example, the channel structure 181 includes a semiconductor layer (also referred to as a channel layer) 185 (e.g. polysilicon) surrounded by one or more insulating layers 189. In an example, the one or more insulating layers 189 includes a blocking insulating layer (e.g., silicon oxide), a charge storage layer (e.g., silicon nitride), a tunneling insulating layer (e.g., silicon oxide) that forms an oxide-nitride-oxide (ONO) structure surrounding the channel layer 185. The channel structure 181 can further include a space 186 within the channel layer 185. The space 186 may be void or filled with an insulating material and can be referred to as an insulating layer 186. The channel structure 181 can have the circular shape in the X-Y plane, and extend in the Z direction. In an example, the blocking insulating layer (e.g., silicon oxide) is formed on the sidewall of a hole (into the stack of layers 190) for the channel structure 181, and then the charge storage layer (e.g., silicon nitride), the tunneling insulating layer, the semiconductor layer 185, and the insulating layer 186 are sequentially stacked from the sidewall. The semiconductor layer 185 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 186 is formed of an insulating material, such as silicon oxide and/or silicon nitride, and/or may be formed as an air gap.

In an embodiment, the channel structure 181 and the stack of layers 190 together form the memory cell string 180. For example, the semiconductor layer 185 corresponds to channel portions for transistors in the memory cell string 180, and the gate layers 195 corresponds to gates of the transistors in the memory cells string 180. Generally, a transistor has a gate that controls a channel, and has a drain and a source at each side of the channel. For simplicity, in the FIG. 3 example, the bottom side of the channel for transistors in FIG. 3 is referred to as the drain, and the upper side of the channel for transistors in FIG. 3 is referred to as the source. The drain and the source can be switched under certain driving configurations. In the FIG. 3 example, the semiconductor layer 185 corresponds to connected channels of the transistors. For a specific transistor, the drain of the specific transistor is connected with a source of a lower transistor below the specific transistor, and the source of the specific transistor is connected with a drain of an upper transistor above the specific transistor in the FIG. 3 example. Thus, the transistors in the memory cell string 180 are connected in series. "Upper" and "lower" are used specific to FIG. 3 where the array die 102 is disposed upside down.

The memory cell string 180 includes memory cell transistors (or referred to as memory cells). A memory cell transistor can have different threshold voltages based on carrier trappings in a portion of the charge storage layer that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programmed state (also referred to as erased state) corresponding to logic "1". When holes are expelled from the floating gate, the threshold voltage of the memory cell transistor is above a predefined value, thus the memory cell transistor is in a programed state corresponding to logic "0" in some examples.

In an example, the memory cell string 180 includes one or more top select transistors configured to couple/de-couple the memory cells in the memory cell string 180 to a bit line, and includes one or more bottom select transistors configured to couple/de-couple the memory cells in the memory cell string 180 to the ACS.

The top select transistors are controlled by top select gates (TSG). For example, when a TSG voltage (voltage applied to the TSG) is larger than a threshold voltage of the top select transistors, the top select transistors in the memory cell string 180 are turned on and the memory cells in the memory cell string 180 are coupled to the bit line (e.g., drain of the string of memory cells is coupled to the bit line); and when the TSG voltage (voltage applied to the TSG) is smaller than the threshold voltage of the top select transistors, the top select transistors are turned off and the memory cells in the memory cell string 180 are de-coupled from the bit line (e.g., drain of the string of memory cells is decoupled from the bit line).

Similarly, the bottom select transistors are controlled by bottom select gates (BSG). For example, when a BSG voltage (voltage applied to the BSG) is larger than a threshold voltage of the bottom select transistors in a memory cell string 180, the bottom select transistors are turned on and the memory cells in the memory cell string 180 are coupled to the ACS (e.g., source of the string of memory cells in the memory cell string 180 is coupled to the ACS); and when the BSG voltage (voltage applied to the BSG) is smaller than the threshold voltage of the bottom select transistors, the bottom select transistors are turned off and the memory cells are de-coupled from the ACS (e.g., source of the string of memory cells in the memory cell string 180 is de-coupled from the ACS).

In the FIG. 3 example, interconnection structures, such as a via 162, a metal wire 163, a bonding structure 164, and the like, can be formed to electrically couple the bottom portion of the semiconductor layer 185 to a bit line (BL). The interconnection structures can be suitably adapted to include additional structure(s), modify one of the via 162, the metal wire 163, and the bonding structure 164, and/or omit one of the via 162, the metal wire 163, and the bonding structure 164.

Further in FIG. 3 example, the staircase region 108 includes a staircase that is formed to facilitate word line (WL) connections to the gates of transistors (e.g., memory cells, top select transistor(s), bottom select transistor(s) and the like). For example, a connection structure (also referred to as a word line connection structure) 150 includes a contact plug (also referred to as a word line contact plug) 151, a via structure 152, and a metal wire 153 that are conductively coupled together. The word line connection structure 150 can electrically couple a WL to a gate terminal of a transistor in the memory cell string 180. The connection structure 150 can be suitably adapted to include additional structure(s), modify one of the contact plug 151, the via structure 152, and the metal wire 153, and/or omit one of the contact plug 151, the via structure 152, and the metal wire 153.

In the FIG. 3 example, the contact structures 170 are formed in the contact region 109. In some embodiments, the contact structures 170 can be formed at the same time as the word line connection structures 150 by processing on the face side of the array die 102. Thus, in some examples, the contact structures 170 have similar structures and/or materials as the word line connection structures 150. Specifically, a contact structure 170 can include a contact plug 171, a via structure 172, and a metal wire 173 that are conductively coupled together. The contact structure 170 can be suitably adapted to include additional structure(s), modify one of the contact plug 171, the via structure 172, and the metal wire 173, and/or omit one of the contact plug 171, the via structure 172, and the metal wire 173.

In some examples, a mask that includes patterns for the contact plugs 171 and the word line contact plugs 151 can be used. The mask is used to form contact holes for the contact plugs 171 and the word line contact plugs 151. An etch process can be used to form the contact holes. In an example, etching of the contact holes for the word line contact plugs 151 can stop on the gate layers 195 and the etching of the contact holes for the contact plugs 171 can stop in the conductive layer 113. Further, the contact holes can be filled with suitable liner layer (e.g., titanium/titanium nitride) and a metal layer (e.g., tungsten) to form the contact plugs, such as the contact plugs 171 and the word line contact plugs 151. The contact structures 170 can extend into the conductive layer 113 by a penetration depth. Specifically, the contact plugs 171 extend through the first etch stop layer 111 and the second etch stop layer 112 and extend into the conductive layer 113 in the example of FIG. 3. Further back end of line (BEOL) processes can be used to form various connection structures, such via structures, metal wires, bonding structures, and the like.

Further, in the FIG. 3 examples, bonding structures are respectively formed on the face sides of the array die 102 and the CMOS die 101. For example, bonding structures 154, 164, and 174 for the word line connection structures 150, the memory cell strings 180, and the contact structures 170, respectively, are formed on the face side of the array die 102, and bonding structures 131, 132, and 134 corresponding to the bonding structures 164, 154, and 174, respectively, are formed on the face side of the CMOS die 101. Metal layers 191-193 can be formed in the COMS die 101, and can be connected to the corresponding bonding structures 131, 132, and 134, respectively.

In the FIG. 3 example, the array die 102 and the CMOS die 101 are disposed face-to-face (circuitry side is face, and the substrate side is back) and bonded together. Corresponding bonding structures on the array die 102 and the CMOS die 101 are aligned and bonded together, and form a bonding interface that conductively couple suitable components on the two dies. For example, the bonding structure 164 and the bonding structure 131 are bonded together to couple the drain side of the memory cell string 180 with a bit line (BL). In another example, the bonding structure 174 and the bonding structure 134 are bonded together to couple a contact structure 170 on the array die 102 with an I/O circuit on the CMOS die 101.

Referring back to FIG. 2, at S212, the first substrate of the first die is removed from the back side of the first die. The removal of the first substrate exposes the memory cell string 180 and the contact structures 170 on the back side of the first die. For example, the removal of the first substrate exposes the end 170a of the contact structure 170.

Figure 4:
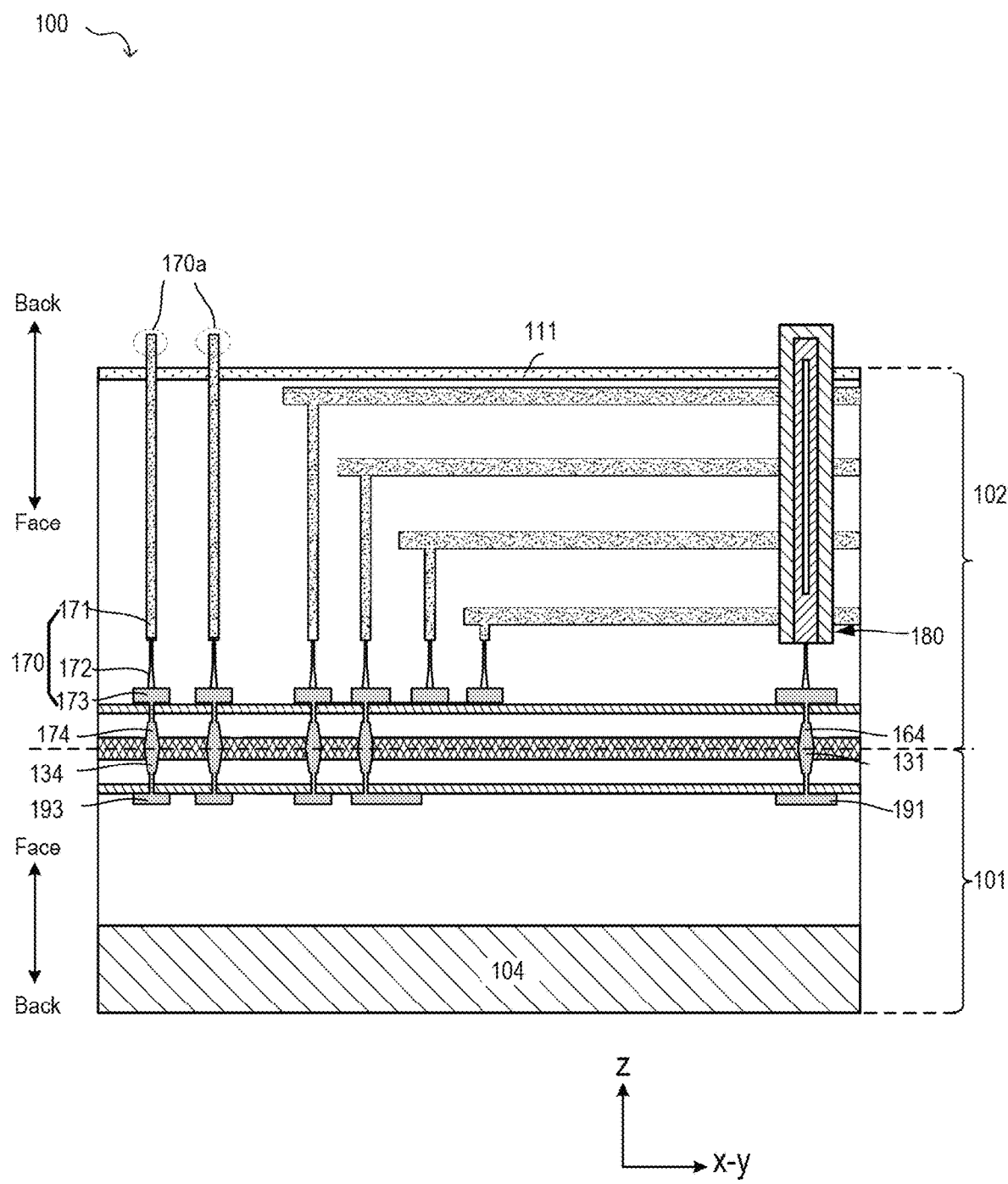

FIG. 4 shows a cross-sectional view of the semiconductor device 100 after the removal of the first substrate 103 from the array die 102. In the FIG. 4 example, the bulk portion 118 and the insulating layer 114 are removed from the back side of the array die 102. Further, the conductive layer 113 and the second etch stop layer 112 are removed from the back side of the array die 102.

In some examples, after a wafer-to-wafer bonding process, a first wafer with array dies is bonded with a second wafer with CMOS dies. Then, the first substrate is thinned from the back side of the first wafer. In an example, a chemical mechanical polishing (CMP) process or a grinding process is used to remove a majority portion of the bulk portion 118 of the first wafer. Further, a suitable etch process can be used to remove a remaining bulk portion 118, the insulating layer 114, the conductive layer 113, and the second etch stop layer 112 from the back side of the first wafer. The removal of the bulk portion 118, the insulating layer 114, the conductive layer 113, and the second etch stop layer 112 can reveal the ends 170a of the contact structures 170 that protrude in the contact region 109. The removal of the bulk portion 118, the insulating layer 114, the conductive layer 113, and the second etch stop layer 112 can also reveal an end of the memory cell string 180 in the core region 107.

Referring back to FIG. 2, steps S214, S216, S218, and S220 can be used to form the semiconductor structures (e.g., 116a-116d) and the pad structures (e.g., 121-123) on the back side of the first die (e.g., the array die 102), and are described with reference to FIGS. 5-10.

Figure 5:
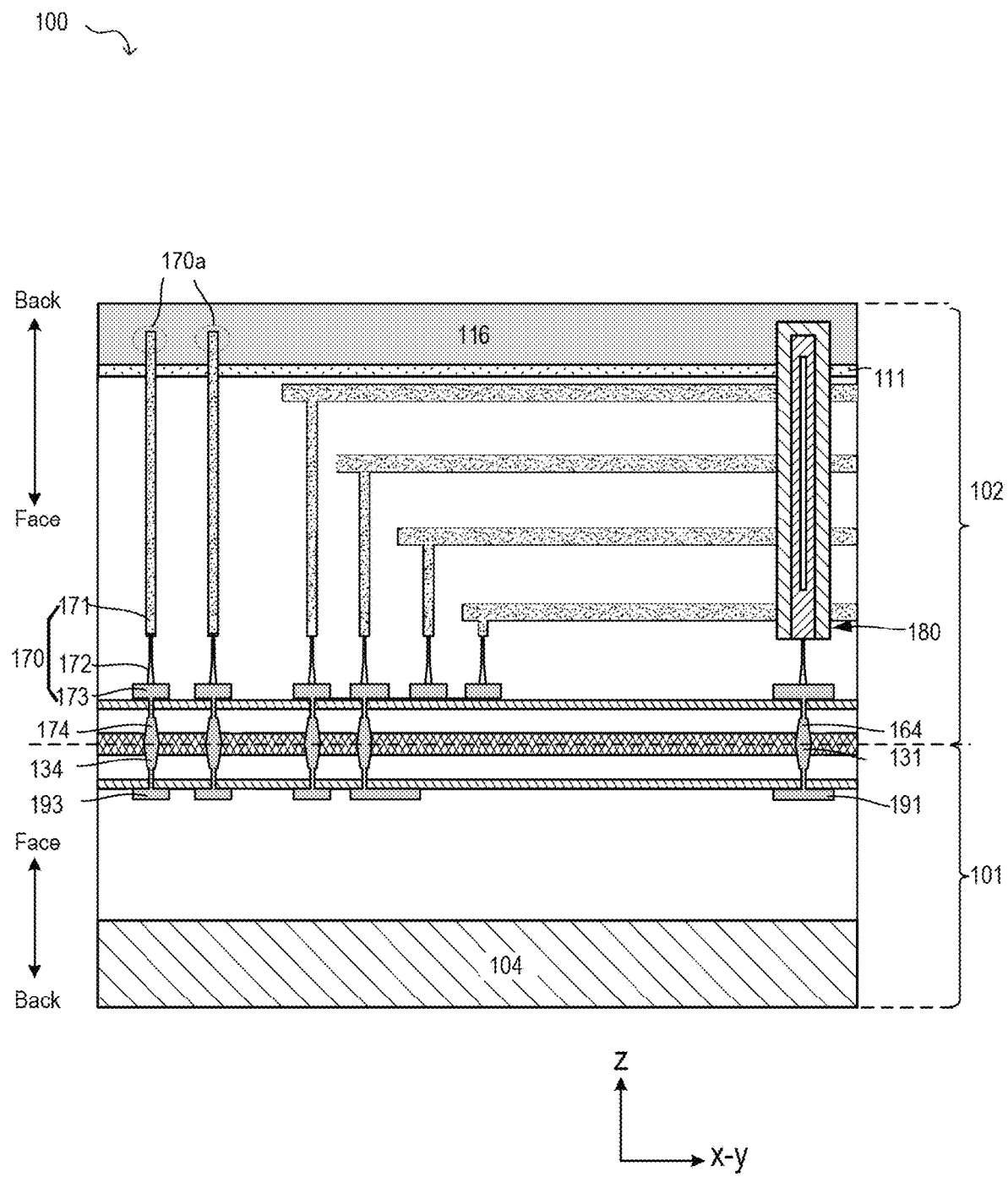

Referring to FIGS. 2 and 5-7, steps S214 and S216 can be used to form the semiconductor structures (e.g., 116a-116d). At S214, a semiconductor layer (e.g., 116 in FIG. 5) used in forming the semiconductor structures is formed over the back side of the first die. Any suitable process, such as CVD, furnace CVD, and/or the like can be used to form the semiconductor layer. According to aspects of the disclosure, the semiconductor layer includes highly doped semiconductor material(s) and can be annealed to further increase conductivity of the semiconductor material(s). The annealing process can facilitate recrystallization of the semiconductor material(s) and further growth of grains, resulting in the semiconductor layer having good conductivity. Referring to FIG. 5, in an example, a semiconductor layer 116 is deposited on the back side of the array die 102 and is over the first etch stop layer 111. The semiconductor layer 116 is also over the exposed memory cell string 180 and the contact structures 170. In an example, the semiconductor layer 116 is disposed over the end 170a of the contact structure 170. The semiconductor layer 116 includes Si (e.g., polysilicon) that is highly doped. The highly doped Si (e.g., polysilicon) in the semiconductor layer 116 is annealed and thus recrystallized to have good conductivity.

Figure 6:
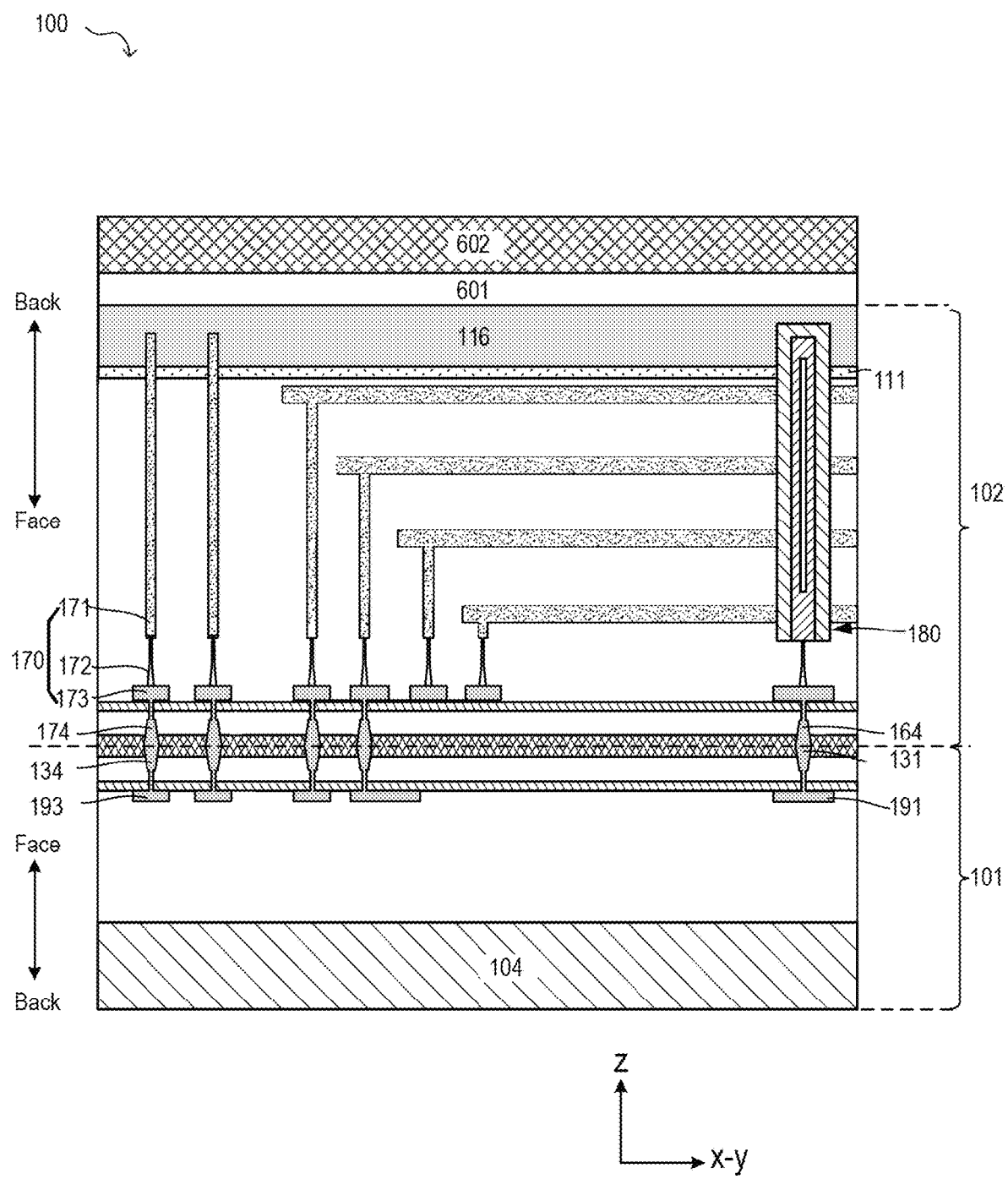
Figure 7:
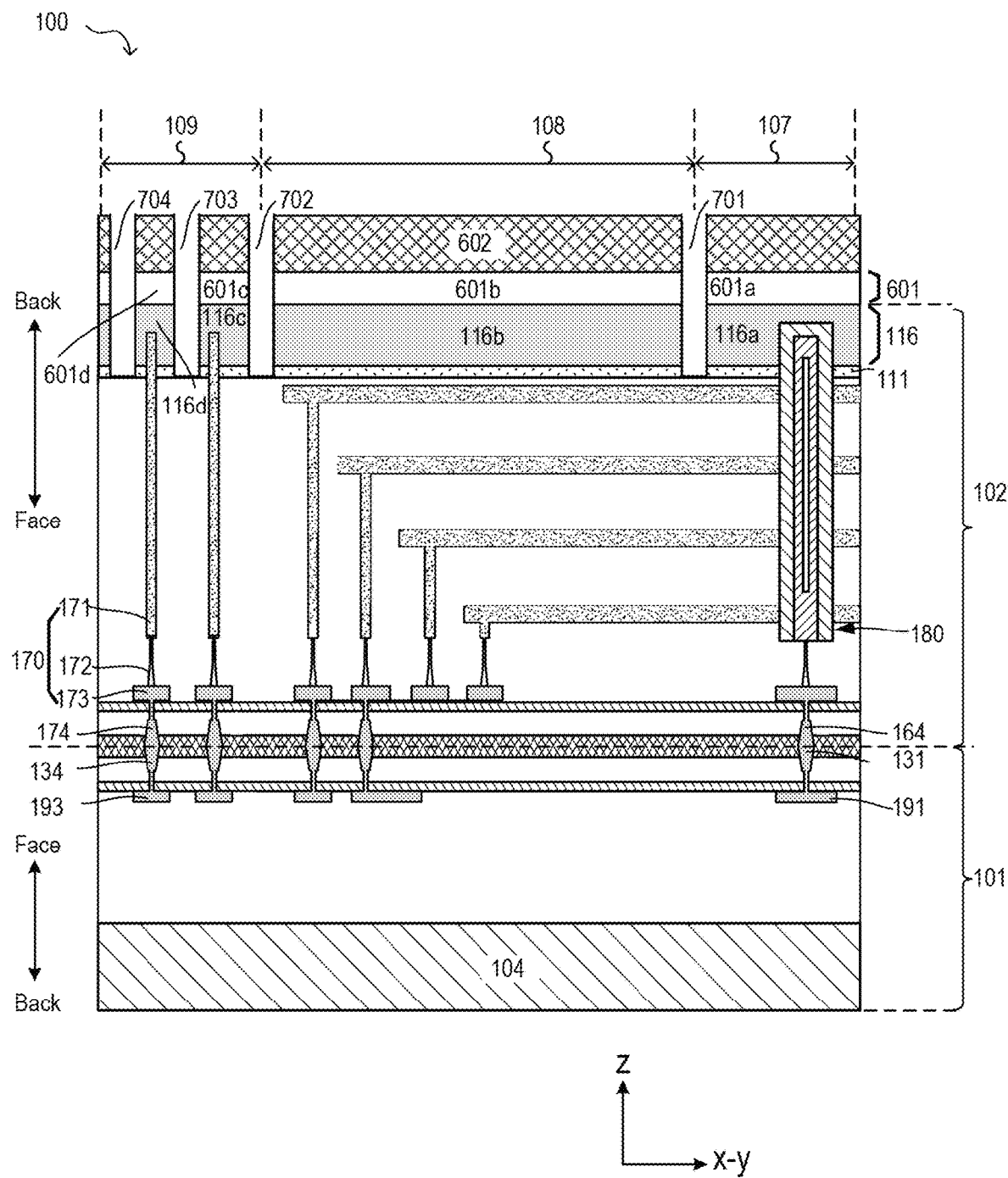

Referring to FIGS. 2, 6, and 7, at S216, the semiconductor structures (e.g., 116a-116d) can be formed from the semiconductor layer (e.g., 116) on the back side of the first die. Referring to FIG. 6, the insulating layer 601 (also referred to as a hard mask layer) and a photoresist layer 602 are formed over the semiconductor layer 116 at the back side of the first die (e.g., the array die 102). The hard mask layer 601 can include one or more insulating materials, such as silicon oxide, silicon nitride, and/or the like. The hard mask layer 601 can include one or more sub-layers. In an example, the hard mask layer 601 includes silicon oxide.

Referring to 7, at the back side of the first die (e.g., the array die 102), a photolithography process is used to define a pattern for the second isolation structures 129a of the insulating layer 129 into the photoresist layer 602 according to a mask. An etch process is used to form first holes 701-704 by removing portions of the hard mask layer 601, the semiconductor layer 116, and the first etch stop layer 111. The portions removed from the semiconductor layer 116 are referred to as first portions of the semiconductor layer 116. The semiconductor structures 116a-116d are formed by removing the first portions of the semiconductor layer 116 and the first holes 701-704 separate the semiconductor structures 116a-116d.

In an example, the etch process includes a dry etch process. In an example, the etch process etches the back side of the first die until the stack of layers 190 including the gate layers 195 and the insulating layers 194. In an example, the stack of layers 190 is intact or minimally affected. Subsequently, the photoresist layer 602 is removed. In an example, such as shown in FIG. 7, the hard mask layer 601 is not removed. Alternatively, a portion of or the entire hard mask layer 601 can be removed.

Figure 8:
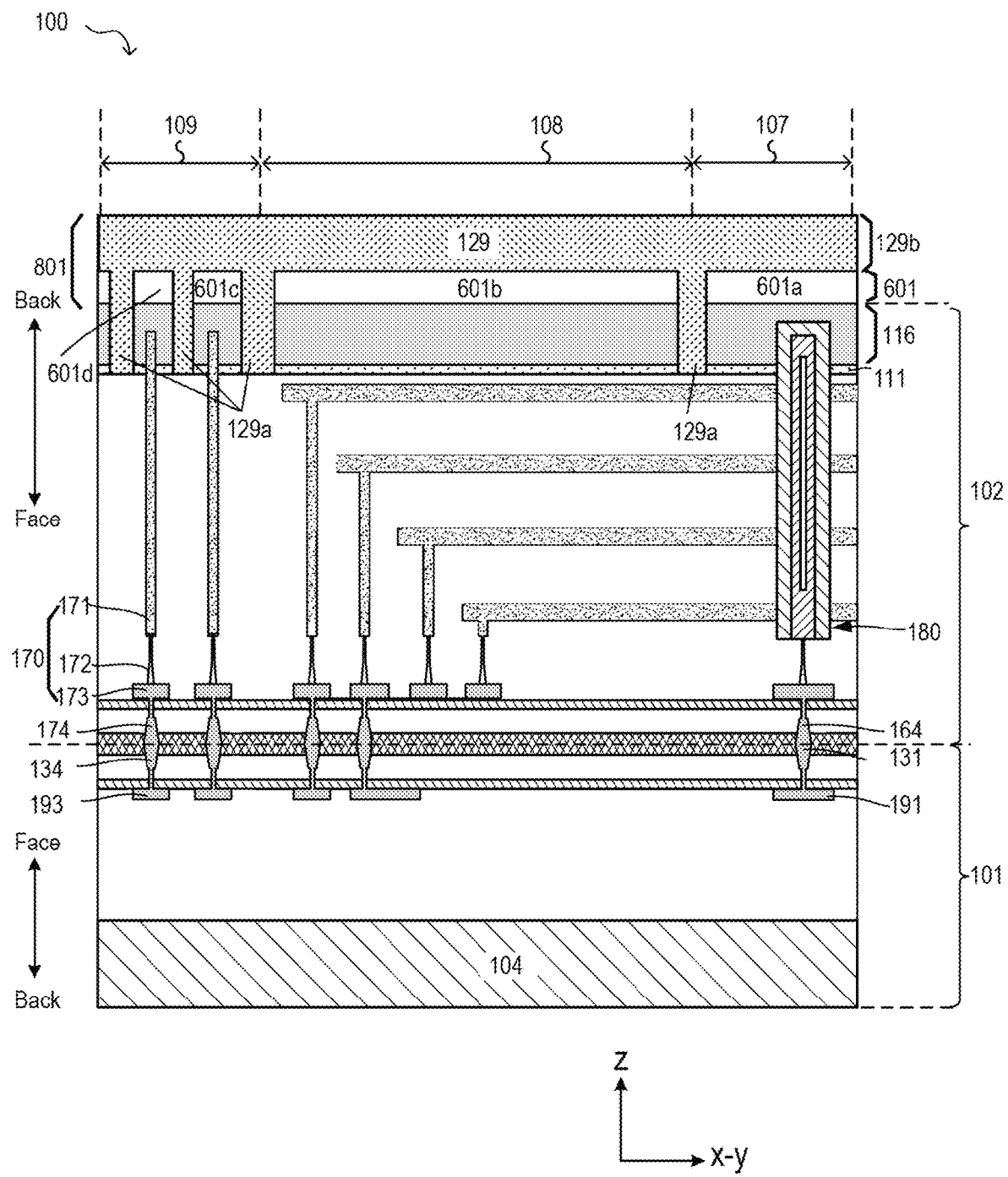

Referring to FIGS. 2 and 8, at S218, an insulating layer (e.g., the insulating layer 129) is formed over the hard mask layer 601 at the back side of the first die (e.g., the array die 102). Further the insulating layer 129 is deposited within the first holes 701-704 and fills the first holes 701-704, and the second isolation structures 129a are formed in the first holes 701-704. Accordingly, a combined insulating layer 801 including the insulating layer 129 and the hard mask layer 601 is formed over the semiconductor layer 116. In an example, the hard mask layer 601 is removed prior to forming the insulating layer 129, and thus the insulating layer 129 is formed over the semiconductor layer 116 and within the first holes 701-704.

Referring to FIG. 8, the array die 102 is separated into the regions 107-109 by two of the second isolation structures 129a. Specifically, the regions 107-108 are separated by the second isolation structures 129a in the first hole 701, and the regions 108-109 are separated by the second isolation structures 129a in the first hole 702. The semiconductor layer 116 is separated into the semiconductor structures 116a-116d by the second isolation structures 129a. Two semiconductor structures (e.g., 116c and 116d) can be separated and electrically isolated by the second isolation structure (e.g., 129a). The hard mask layer 601 is separated into the portions 601a-601d by the second isolation structures 129a.

Referring to FIGS. 1, 2, 9, and 10, at S220, pad structures (e.g., 121-123 in the semiconductor device 100) are formed at the back side of the first die (e.g., the array die 102).

Figure 9:
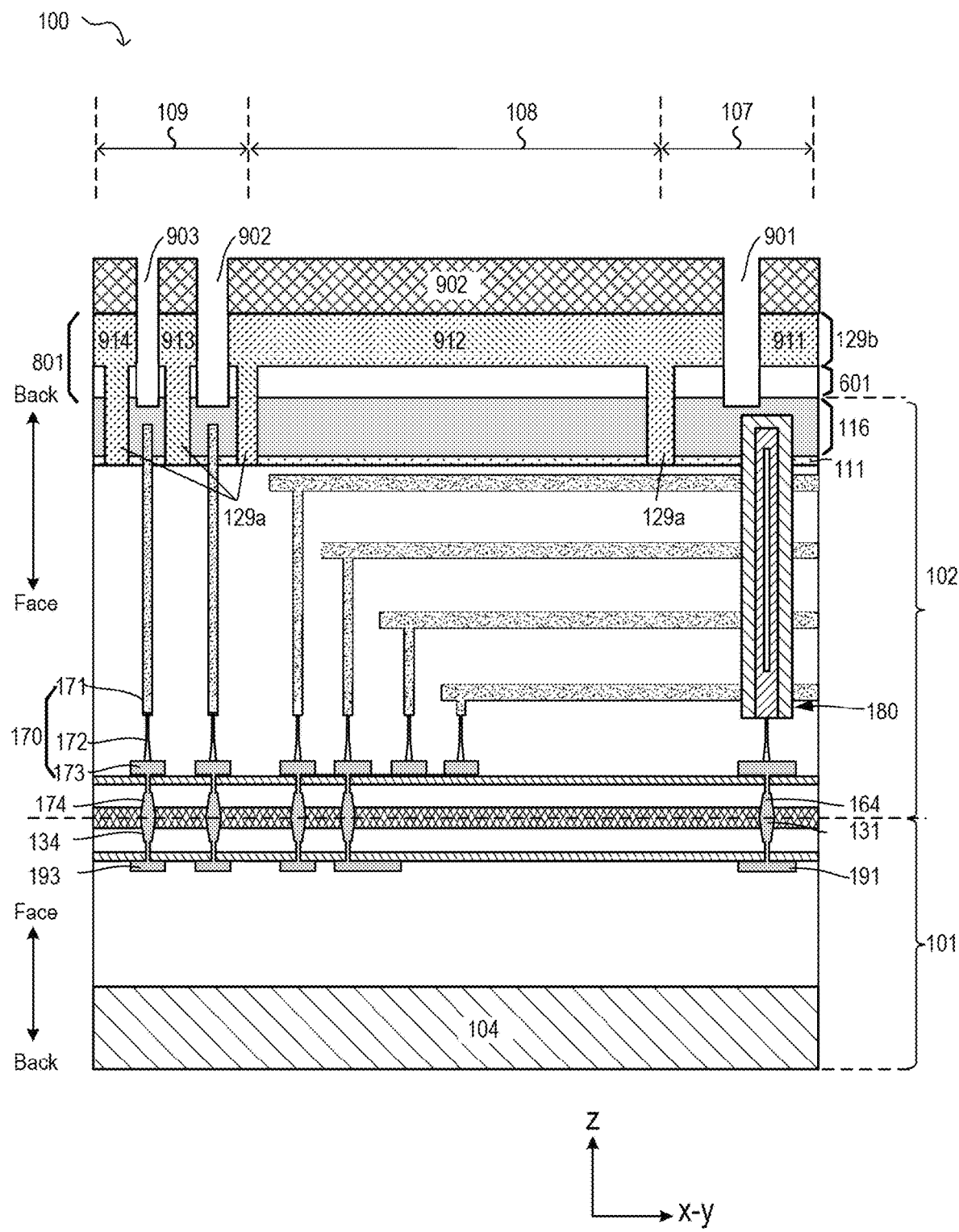

Referring to FIG. 9, a photoresist layer 902 is formed over the insulating layer 129. Subsequently, a photolithography process is used to define a pattern for the pad structures (e.g., 121-123) into the photoresist layer 902 according to a mask. An etch process is used to form second holes 901-903 that are above respective semiconductor structures by removing second portions of the insulating layer 129 and corresponding portions of the hard mask layer 601. In an example, the etch process further etches into the semiconductor layer 116 to remove respective top portions of the semiconductor structures 116a-116d. In an example, the etch process includes a dry etch process.

Figure 10:
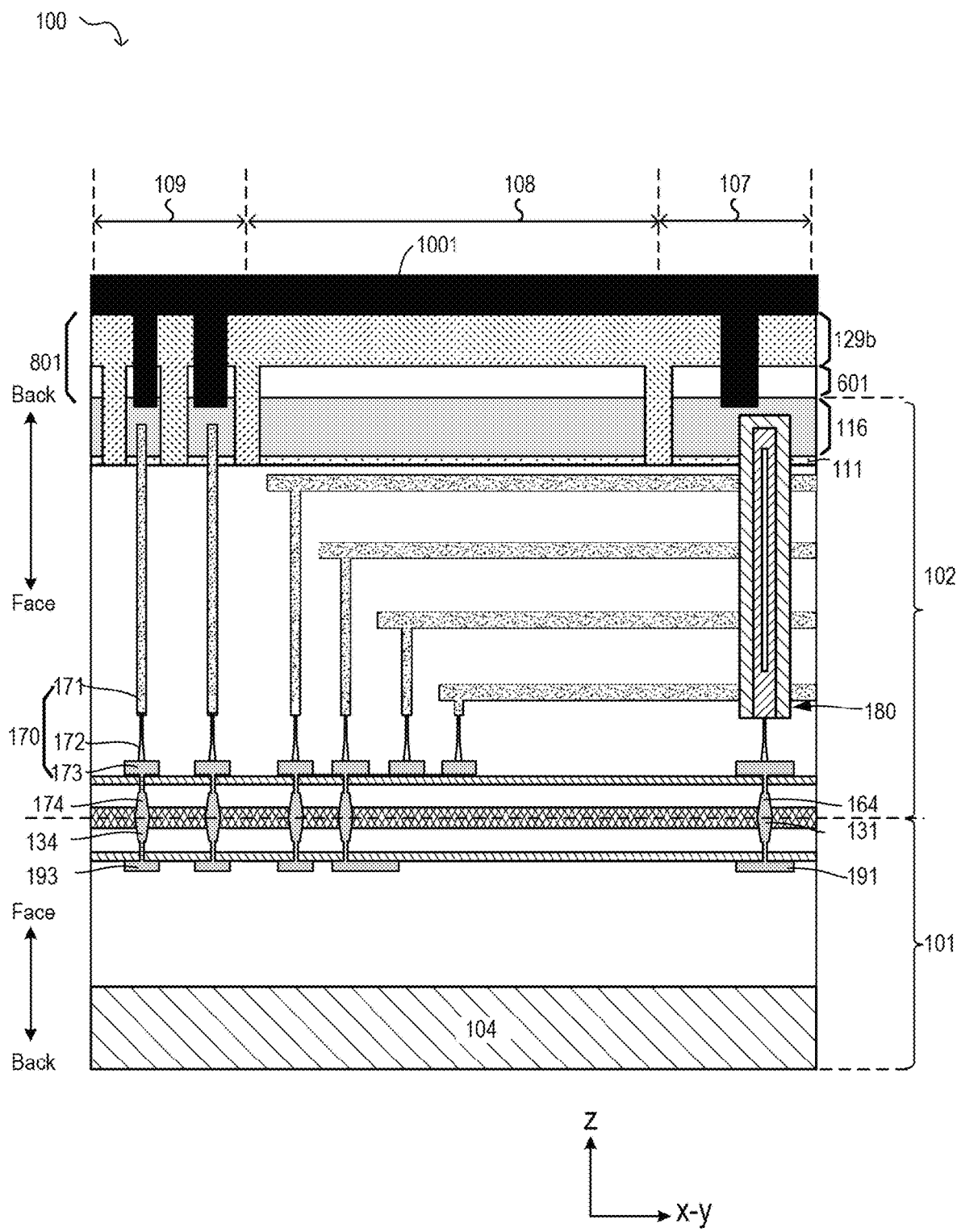

Referring to FIGS. 1 and 10, the pad structures are formed at the back side of the first die (e.g., the array die 102). In an example, the photoresist layer 902 is removed. Subsequently, a metal layer 1001 is formed, for example, by depositing metallic material(s) on the back side of the array die 102 using any suitable method, such as PVD. In an example, the metal layer (e.g., a Cu layer) 1001 is electroplated on the back side of the first die. The metal layer 1001 fills the second holes 901-903.

Referring to FIG. 1, a portion of the metal layer 1001 that is over the insulating layer 129 can be removed, for example, by an etch process, a CMP, and/or the like. Portions of the metal layer 1001 in the second holes 901-903 form the pad structures (e.g., 121-123). The pad structures (e.g., 121-123) are separated and electrically isolated by the first insulating structures 911-914 of the insulating layer 129.

The metal layer 1001 can include one or more materials, such as metallic material(s) Al, Cu, W, and/or the like. The metal layer 1001 can include one or more layers. In some embodiments, interfacing layer(s) can be formed between the metallic material(s) (e.g., Al) and the semiconductor layer 116. In some examples, metal silicide thin films can be used as the interfacing layer(s). In an example, a metal silicide thin film can be used to enable ohmic contacts between Al and the semiconductor layer 116. In another example, a metal silicide thin film is used as diffusion barriers to prevent aluminum diffusion into the semiconductor layer 116.

As the metal layer 1001 is formed over the semiconductor layer 116, the pad structures (e.g., 121-123) are formed over the respective semiconductor structures (e.g., 116a, 116c, and 116d). Thus, in some examples, contamination to the channel structures 181 from the formation of the metal layer 1001 is reduced or eliminated. In an example, using semiconductor materials, such as polysilicon in the semiconductor structures (e.g., 116a, 116c, and 116d), to facilitate connection between the pad structures and the respective contact structures reduces stress in the semiconductor device.

In the present disclosure, one pad structure (e.g., 121) is shown in the core region 107. In general, one or more pad structures can be formed in the core region 107 using the process described in the present disclosure.

A semiconductor device can include a first wafer and a second wafer bonded together. In an example, the first wafer includes the first die (e.g., the array die 102), and the second wafer includes the second die (e.g., the CMOS die 101). The process 200 as shown in FIGS. 1-10 can be suitably adapted to the semiconductor device including the first wafer and the second wafer bonded together. For example, a substrate of one (e.g., the first wafer) of the first wafer and the second wafer is removed similar to those described with reference to FIGS. 2-4. Semiconductor structures are formed on a back side of the first wafer as described with reference to FIGS. 2 and 5-8. Subsequently, pad structures are formed on the back side of the first wafer as described with reference to FIGS. 2 and 9-10.

In an example, after forming pad structures on the first wafer, dies can be formed by dicing the bonded first wafer and the second wafer. One of the dies can include the first die and the second die.

The wafer fabrication process can continue further processes, such as, passivation, testing, dicing and the like.

Figure 11:
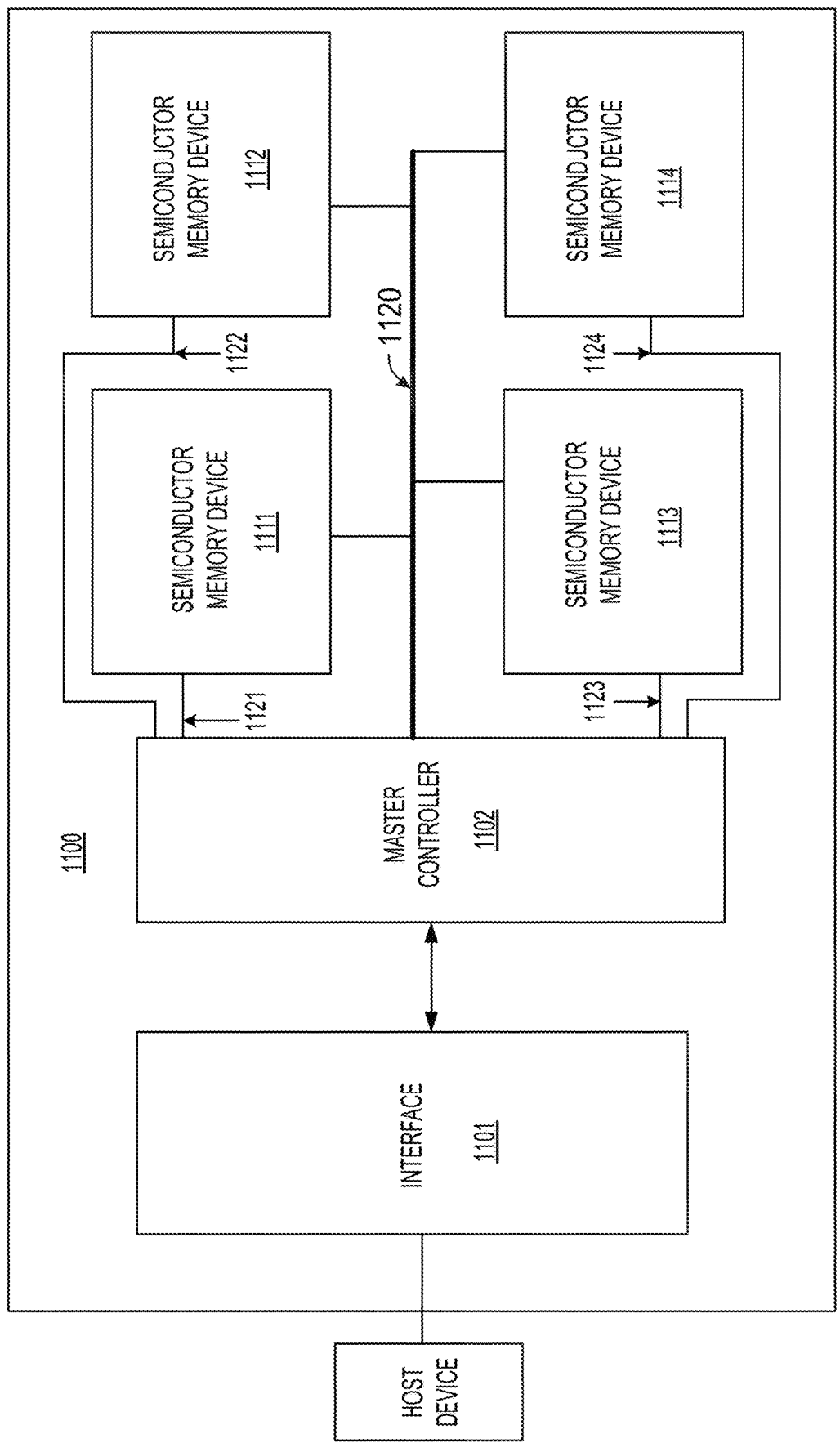
FIG. 11 shows a block diagram of a memory system device according to some examples of the disclosure.

FIG. 11 shows a block diagram of a memory system device (or a memory system) 1100 according to some examples of the disclosure. The memory system device 1100 includes one or more semiconductor devices, such as shown by semiconductor devices 1111-1114, that are respectively configured similarly as the semiconductor device 100. In some examples, the semiconductor device 100 and the semiconductor devices 1111-1114 are semiconductor memory devices. In some examples, the memory system device 1100 is a solid state drive (SSD).

The memory system device 1100 includes other suitable components. In an example, the memory system device 1100 includes a controller or master controller 1102. For example, the memory system device 1100 includes an interface 1101 and the controller coupled together as shown in FIG. 11. The memory system device 1100 can include a bus 1120 that couples the master controller 1102 with the semiconductor devices 1111-1114. In addition, the master controller 1102 is connected with the semiconductor devices 1111-1114 respectively, such as shown by respective control lines 1121-1124.

The interface 1101 is suitably configured mechanically and electrically to connect between the memory system device 1100 and a host device, and can be used to transfer data between the memory system device 1100 and the host device.

The master controller 1102 is configured to connect the respective semiconductor devices 1111-1114 to the interface 1101 for data transfer. For example, the master controller 1102 is configured to provide enable/disable signals respectively to the semiconductor devices 1111-1114 to active one or more semiconductor devices 1111-1114 for data transfer.

The master controller 1102 is responsible for the completion of various instructions within the memory system device 1100. For example, the master controller 1102 can perform bad block management, error checking and correction, garbage collection, and the like.

In some embodiments, the master controller 1102 is implemented using a processor chip. In some examples, the master controller 1102 is implemented using multiple microcontroller units (MCUs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first die comprising a first contact structure formed on a face side of the first die;
   a first semiconductor structure formed with a semiconductor layer that is disposed on a back side of the first die, the first semiconductor structure being conductively connected with the first contact structure from the back side of the first die; and
   a first pad structure disposed on the back side of the first die and conductively coupled with the first semiconductor structure, wherein
   a first end of the first pad structure protrudes into the first semiconductor structure along a direction from the back side of the first die to the face side of the first die, such that the first end of the first pad structure is positioned lower than an upper surface of the first semiconductor structure and higher than a lower surface of the first semiconductor structure while a second end of the first pad structure is positioned higher than the upper surface of the first semiconductor structure, and one end of the first contact structure protrudes into the first semiconductor structure along a direction from the face side of the first die to the back side of the first die, such that the first pad structure and the first contact structure are indirectly coupled conductively via the first semiconductor structure.

2. The semiconductor device of claim 1, wherein an end of the first contact structure protrudes into the first semiconductor structure without connecting to the first pad structure.

3. The semiconductor device of claim 1, further comprising:
a second semiconductor structure that is disposed on a back side of the first die and is conductively connected with a second contact structure from the back side of the first die,
a second pad structure disposed on the back side of the first die and conductively coupled with the second semiconductor structure, and
a first isolation structure disposed between the first pad structure and the second pad structure and electrically isolating the first pad structure from the second pad structure.

4. The semiconductor device of claim 3, further comprising:
a second isolation structure disposed between the first and second semiconductor structures and electrically isolating the first semiconductor structure from the second semiconductor structure.

5. The semiconductor device of claim 1, wherein the first semiconductor structure includes a doped semiconductor material, and the first pad structure includes a metallic material.

6. The semiconductor device of claim 5, wherein the doped semiconductor material is polysilicon.

7. The semiconductor device of claim 1, wherein the first die includes a core region that includes a vertical memory cell string, a staircase region for making connections to gates of memory cells in the vertical memory cell string, and a contact region including the first contact structure, the core region, the staircase region, and the contact region being electrically isolated by respective isolation structures of an insulating layer disposed on the back side of the first die.

8. The semiconductor device of claim 7, further comprising:
a pad structure disposed on the back side of the first die and conductively connected with the vertical memory cell string in the core region through a semiconductor structure that is disposed between the pad structure and the vertical memory cell string.

9. The semiconductor device of claim 7, further comprising:
a second die comprising a periphery circuit for the vertical memory cell string on a face side of the second die, the first die and the second die being bonded face-to-face.

10. The semiconductor device of claim 9, wherein the first contact structure on the first die is electrically coupled to an input/output circuit on the second die via bonding structures.

11. A memory system, comprising:
a semiconductor device including:
a first die comprising a first contact structure formed on a face side of the first die;
a first semiconductor structure formed with a semiconductor layer that is disposed on a back side of the first die, the first semiconductor structure being conductively connected with the first contact structure from the back side of the first die; and
a first pad structure disposed on the back side of the first die and conductively coupled with the first semiconductor structure, wherein
a first end of the first pad structure protrudes into the first semiconductor structure along a direction from the back side of the first die to the face side of the first die, such that the first end of the first pad structure is positioned lower than an upper surface of the first semiconductor structure and higher than a lower surface of the first semiconductor structure while a second end of the first pad structure is positioned higher than the upper surface of the first semiconductor structure, and one end of the first contact structure protrudes into the first semiconductor structure along a direction from the face side of the first die to the back side of the first die, such that the first pad structure and the first contact structure are indirectly coupled conductively via the first semiconductor structure; and a controller configured to control operations of the semiconductor device, the controller being connected with the semiconductor device.

12. The semiconductor device of claim 7, wherein the first contact structure extends vertically through a respective part of the insulating layer that is situated in the contact region.

13. The semiconductor device of claim 7, wherein the first contact structure includes two or more structures conductively coupled together, the two or more structures being selected from a contact plug, a via structure, and a metal wire.

14. The semiconductor device of claim 13, wherein the contact plug is formed with a contact hole that is filled with a liner layer and a metal layer therein.

15. The semiconductor device of claim 8, wherein the vertical memory cell string includes a channel structure extending vertically through a stack of layers that includes gate layers and insulating layers stacked alternatingly.

16. The semiconductor device of claim 15, wherein the channel structure includes a channel layer formed with a semiconductor material, an insulating layer surrounding the channel layer, and a space formed within the channel layer.

17. The semiconductor device of claim 15, wherein one end of the channel structure protrudes into the semiconductor structure without connecting to the pad structure.

18. The semiconductor device of claim 15, the semiconductor structure is formed with a respective part of the semiconductor layer that is situated in the core region.

19. The semiconductor device of claim 15, wherein the gate layers are made of a gate stack material.

20. The semiconductor device of claim 15, wherein the gate layers are high dielectric constant gate insulator layers or metal gate electrodes.

* * * * *